(12) United States Patent
Huang et al.

(10) Patent No.: US 7,023,090 B2
(45) Date of Patent: Apr. 4, 2006

(54) BONDING PAD AND VIA STRUCTURE DESIGN

(75) Inventors: Tai-Chun Huang, Kaohsiung (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 190 days.

(21) Appl. No.: 10/353,554

(22) Filed: Jan. 29, 2003

(65) Prior Publication Data

US 2004/0145045 A1 Jul. 29, 2004

(51) Int. Cl.
*H01L 23/52* (2006.01)

(52) U.S. Cl. ............... 257/756; 257/758; 257/762; 257/773; 257/775; 257/776

(58) Field of Classification Search ........ 438/612, 438/926, FOR 354, FOR 355, 666; 257/758, 257/762, 765, 773, 775, 776; 228/180.22
See application file for complete search history.

(56) References Cited

U.S. PATENT DOCUMENTS

| | | | | |
|---|---|---|---|---|
| 3,808,474 A * | 4/1974 | Cooke et al. | ............... | 257/706 |
| 4,091,529 A * | 5/1978 | Zaleckas | ............... | 29/843 |
| 4,204,218 A * | 5/1980 | Fox et al. | ............... | 257/775 |
| 4,558,345 A * | 12/1985 | Dwyer et al. | ............... | 257/786 |
| 4,865,999 A * | 9/1989 | Xi et al. | ............... | 438/83 |
| 4,984,061 A * | 1/1991 | Matsumoto | ............... | 257/776 |
| 4,998,154 A * | 3/1991 | Surridge et al. | ............... | 257/21 |
| 5,334,866 A * | 8/1994 | Kubo | ............... | 257/207 |
| 5,426,266 A * | 6/1995 | Brown et al. | ............... | 174/267 |
| 5,962,919 A | 10/1999 | Liang et al. | ............... | 257/748 |
| 5,965,903 A * | 10/1999 | Chittipeddi et al. | ............... | 257/48 |
| 5,985,765 A | 11/1999 | Hsiao et al. | ............... | 438/694 |
| 6,100,589 A * | 8/2000 | Tanaka | ............... | 257/758 |
| 6,136,620 A * | 10/2000 | Chittipeddi et al. | ............... | 438/18 |
| 6,159,841 A * | 12/2000 | Williams et al. | ............... | 438/619 |
| 6,165,886 A | 12/2000 | Lin et al. | ............... | 438/612 |
| 6,191,023 B1 | 2/2001 | Chen | ............... | 438/612 |
| 6,232,662 B1 * | 5/2001 | Saran | ............... | 257/750 |
| 6,255,586 B1 * | 7/2001 | Kim et al. | ............... | 174/52.1 |
| 6,258,715 B1 | 7/2001 | Yu et al. | ............... | 438/648 |
| 6,306,749 B1 | 10/2001 | Lin | ............... | 438/612 |
| 6,313,541 B1 | 11/2001 | Chan et al. | ............... | 257/786 |
| 6,489,228 B1 * | 12/2002 | Vigna et al. | ............... | 438/612 |
| 6,551,916 B1 | 4/2003 | Lin et al. | ............... | 438/612 |
| 6,720,248 B1 * | 4/2004 | Ryo | ............... | 438/622 |
| 6,744,114 B1 * | 6/2004 | Dentry et al. | ............... | 257/532 |
| 2001/0005039 A1 * | 6/2001 | Russell | ............... | 257/666 |
| 2001/0020749 A1 | 9/2001 | Lin et al. | ............... | 257/782 |
| 2002/0115280 A1 * | 8/2002 | Lin et al. | ............... | 438/617 |
| 2003/0003701 A1 * | 1/2003 | Subramanian et al. | ............... | 438/586 |
| 2003/0232504 A1 * | 12/2003 | Eppler et al. | ............... | 438/709 |
| 2004/0173910 A1 * | 9/2004 | Usami et al. | ............... | 257/762 |

* cited by examiner

*Primary Examiner*—David E. Graybill
(74) *Attorney, Agent, or Firm*—Haynes and Boone, LLP

(57) ABSTRACT

A bonding pad design, comprising: a substrate; a lower series of metal pads upon the substrate; and an intermediate series of metal pads over the lower series of metal pads. The lower series of metal pads and the intermediate series of metal pads being connected by a respective series of intermediate interconnects and each series of intermediate metal pads being interlocked by a respective series of extensions.

43 Claims, 6 Drawing Sheets

BONDING PAD AND VIA STRUCTURE DESIGN

FIELD OF THE INVENTION

The present invention relates generally to semiconductor fabrication and more specifically to semiconductor bonding pad and via structure design.

BACKGROUND OF THE INVENTION

Current bond pad structures have all metal pads having the same size from pad to pad and from the top layer pad through the lower layer pads. Further, the pads too easily peel-off or lift-off during wire bonding.

U.S. Pat. No. 6,165,886 to Lin et al. describes a bonding pad design having stress bumps.

U.S. Pat. No. 6,258,715 B1 to Yu et al. describes a bonding pad process using dummy plugs.

U.S. Pat. No. 6,191,023 B1 to Chen and U.S. Pat. No. 5,962,919 to Liang et al. describe bonding pad processes U.S. Pat. No. 5,985,765 to Hsiao et al. describes a bonding pad method using capping layer when etching bonding pad passivation openings.

U.S. Pat. No. 6,306,749 B1 to Liu et al. describes a method for fabricating a bonding pad having an edge strengthening structure.

U.S. Pat. No. 6,313,541 B1 to Chan et al. describes a bonding pad having an edge strengthening structure.

U.S. Publication No. US 2001/0020749 to Lin et al. describes another bonding pad structure having an edge strengthening structure.

SUMMARY OF THE INVENTION

Accordingly, it is an object of one or more embodiments of the present invention to provide an improved bonding pad design.

Other objects will appear hereinafter.

It has now been discovered that the above and other objects of the present invention may be accomplished in the following manner. Specifically, a bonding pad design comprises: a substrate; a lower series of metal pads upon the substrate; and an intermediate series of metal pads over the lower series of metal pads. The lower series of metal pads and the intermediate series of metal pads being connected by a respective series of intermediate interconnects and each series of intermediate metal pads being interlocked by a respective series of extensions.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

First Embodiment—FIGS. 1 to 4

Figure 1:
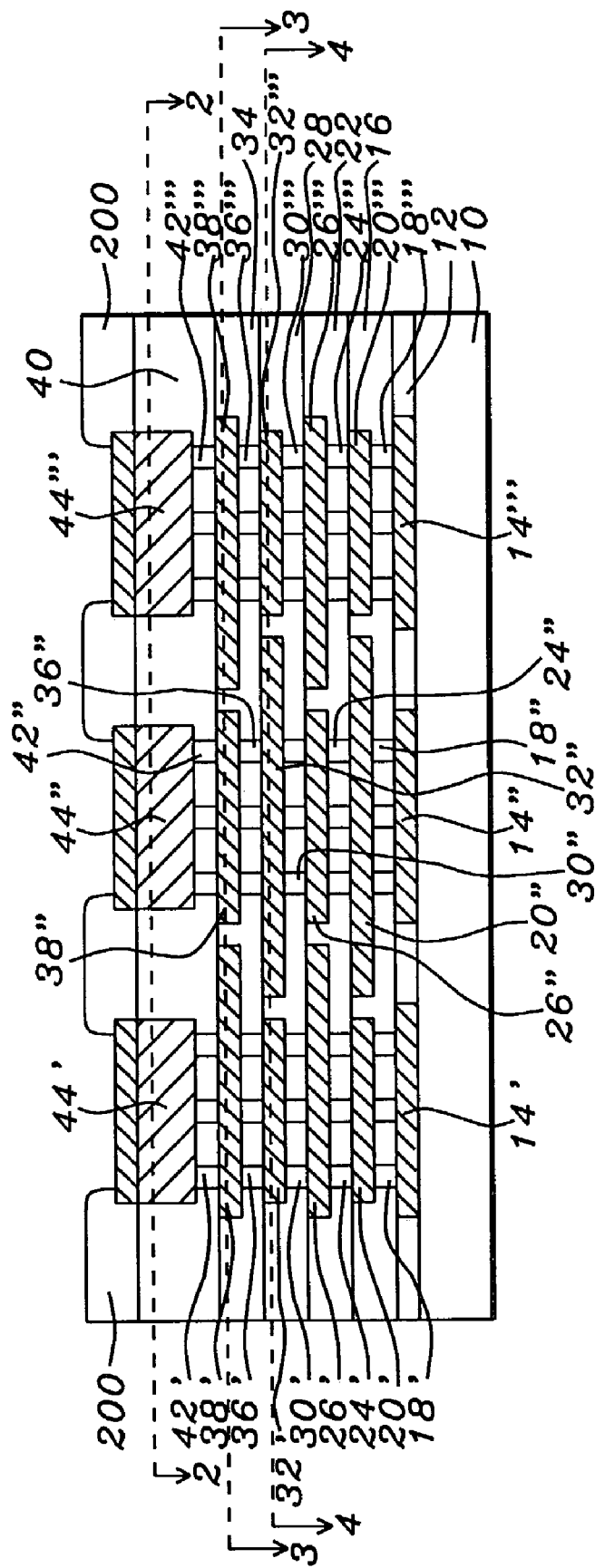
FIGS. 1 to 4 schematically illustrates a first preferred embodiment of the present invention.
Figure 2:
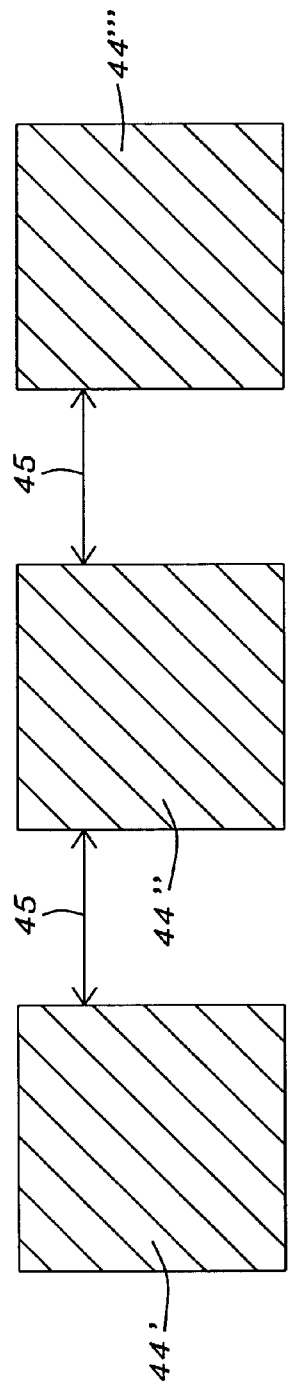
Figure 3:
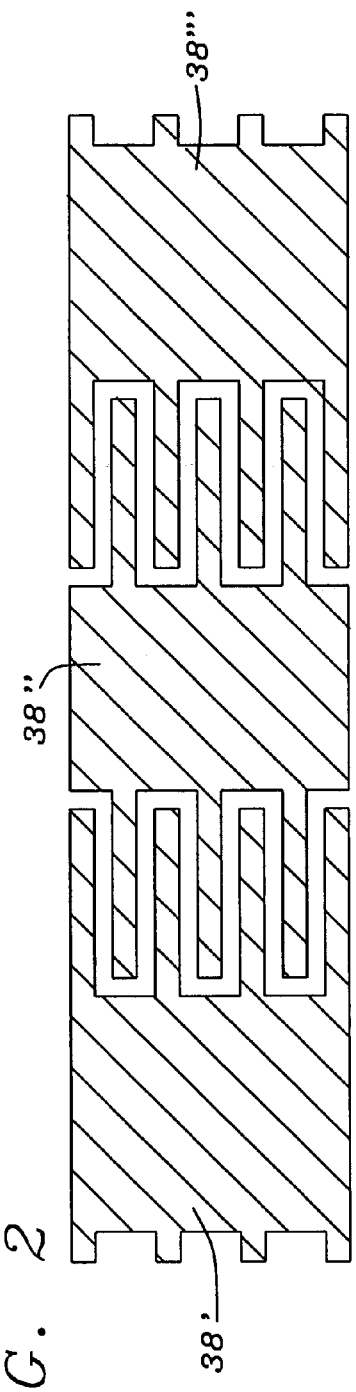
Figure 4:
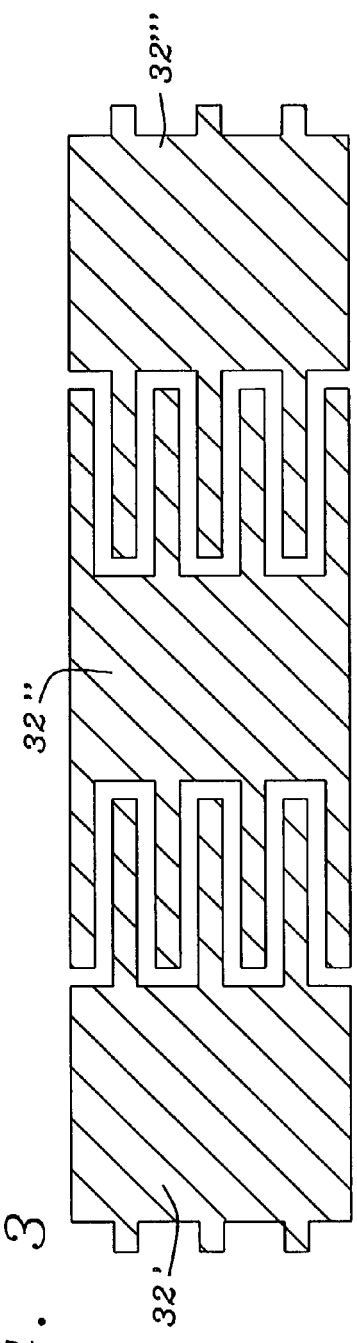

FIGS. 1 to 4 illustrate a first preferred embodiment of the present invention with FIG. 1 being a cross-sectional view and FIGS. 2 to 4 being plan views of FIG. 1 at respective lines 2—2, 3—3 and 4—4 and illustrating only the top metal pads/bonding pads 44', 44", 44''' and the immediately underlying metal pads 38', 38", 38''' and 32', 32", 32''', respectively.

Cross-Sectional View—FIG. 1

As shown in FIG. 1, substrate 10 has a series of metal pads 14', 14", 14'''; 20', 20", 20'''; 26', 26", 26'''; 32', 32", 32''' and 38', 38", 38''' formed thereover that are separated by respective intermetal dielectric (IMD) layers 16, 22, 28, 34 and connected by a series of respective interconnects/vias 18', 18", 18'''; 24', 24", 24'''; 30', 30", 30''' and 36', 36", 36'''. Respective top metal pads/bonding pads 44', 44", 44''' are separated from the upper metal pads 38', 38", 38''' by uppermost intermetal dielectric (IMD) layer 40 and connected to the upper metal pads 38', 38", 38''' by upper interconnects/vias 42', 42", 42'''. Lowermost metal pads 14', 14", 14''' are formed within dielectric layer 12 formed upon substrate 10. Patterned passivation layer 200 overlies uppermost IMD layer 40, exposing at least a portion of top metal pads/bonding pads 44', 44", 44'''.

Substrate 10 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor substrate" is meant to include devices formed within a semiconductor wafer and the layers overlying the wafer.

Dielectric layer 12 and IMD layers 16, 22, 28, 34 are preferably comprised of a dielectric material having a dielectric constant of less than about 3.0 (low-k), undoped silica glass or fluorine-doped silica glass (FSG) and more preferably a dielectric material having a dielectric constant of less than about 3.0. Uppermost IMD layer 40 is preferably comprised of undoped silica glass (USG). Passivation layer 200 is preferably comprised of silicon nitride (SiN).

Interconnects 18', 18", 18'''; 24', 24", 24'''; 30', 30", 30''' and 36', 36", 36''' are preferably comprised of copper or tungsten and are more preferably copper. Metal pads 14', 14", 14'''; 20', 20", 20'''; 26', 26", 26'''; 32', 32", 32''' and 38', 38", 38''' are preferably comprised of copper or aluminum and are more preferably copper. Top metal pads/bonding pads 44', 44", 44''' are preferably comprised of an aluminum layer overlying a copper layer as shown in FIG. 1.

Interlocking Structure of Intermediate Metal Pads 20', 20", 20'''; 26', 26", 26'''; 32', 32", 32''' and 38', 38", 38'''

As shown in FIG. 1, alternating layers of intermediate metal pads 20', 20", 20'''; 26', 26", 26'''; 32', 32", 32''' and 38', 38", 38''' have a vertical interlocking, interleaving design whereby, for example:

upper outer metal pads 38', 38''' have extensions directed towards upper inner metal pad 38";

the next lower inner metal pad 32" has extensions extending towards the respective next lower outer metal pads 32', 32'''; with each further next lower metal pad layers 26', 26", 26'''; 20', 20", 20''' so alternating to form a bonding pad design having an underlying interlocking, interleaving metal pad design.

The lowermost metal pads 14', 14", 14''' may also have extensions (not shown) just as do lower metal pads 20', 20", 20''' and may also have non-symmetric extensions.

Although the extensions are illustrated as being rectangular in shape, they may comprise other shapes as well, such as rounded, hooked, rectangular, finger-shaped etc.

Although FIG. 1 illustrates a series of five metal pad layers 14', 14", 14'''; 20', 20", 20'''; 26', 26", 26'''; 32', 32", 32''' and 38', 38", 38''', there may be less or more metal pad layers.

Plan Views—FIGS. 2 to 4

The top metal pads/bonding pads 44', 44", 44''' are preferably rectangular shaped or, as shown in FIG. 2, square shaped for bonding purposes, and are spaced apart as at 45 by preferably from about 2 to 400 μm and more preferably from about 2 to 100 μm. Lowermost metal pads 14', 14", 14''' are also preferably rectangular shaped or square shaped.

Adjacent intermediate metal pads 20', 20", 20'''; 26', 26", 26'''; 32', 32", 32''' and 38', 38", 38''' also have a horizontal interlocking, interleaving design in the horizontal plane as well with FIG. 3 illustrating the interlocking, interleaving design of intermediate metal pads 38', 38", 38''' and FIG. 4 illustrating the interlocking, interleaving design of the next lower intermediate metal pads 32', 32", 32'''.

The adjacent metal pads of layers 20', 20", 20'''; 26', 26", 26'''; 32', 32", 32''' and 38', 38", 38''' have an horizontal interlocking, interleaving design whereby, for example:

(see FIG. 3) outer metal pads 38', 38''' have extensions directed towards inner metal pad 38";
alternating with opposing extensions of inner metal pad 38" directed towards outer metal pads 38', 38''' to form an interlocking, interleaving metal pad design;

with the (see FIG. 4) the next lower layer of outer metal pads 32', 32''' having extensions directed towards inner metal pad 32" (the extensions of outer metal pads 32', 32''' not under the extensions of the next upper layer of outer metal pads 38', 38''');
alternating with opposing extensions of inner metal pad 32" directed towards outer metal pads, 32', 32''' (the extensions of inner metal pads 32" not under the extensions of the next upper inner metal pad 32') to form a bonding pad design having an underlying interlocking, interleaving metal pad design.

Although the extensions are illustrated as being rectangular in shape, they may comprise other shapes as well, such as rounded, hooked, rectangular, finger-shaped etc.

It is also noted that while inner metal pads 14", 20", 26", 32", 38" (and the corresponding interconnects 18", 24", 30", 36", 42") are active, it is possible to comprise outer metal pads 14', 20', 26', 32', 38' (and the corresponding interconnects 18', 24', 30', 36', 42') and/or outer metal pads 14''', 20''', 26''', 32''', 38''' (and the corresponding interconnects 18''', 24''', 30''', 36''', 42''') as dummy structures.

Second Embodiment—FIGS. 5 to 8

Figure 5:
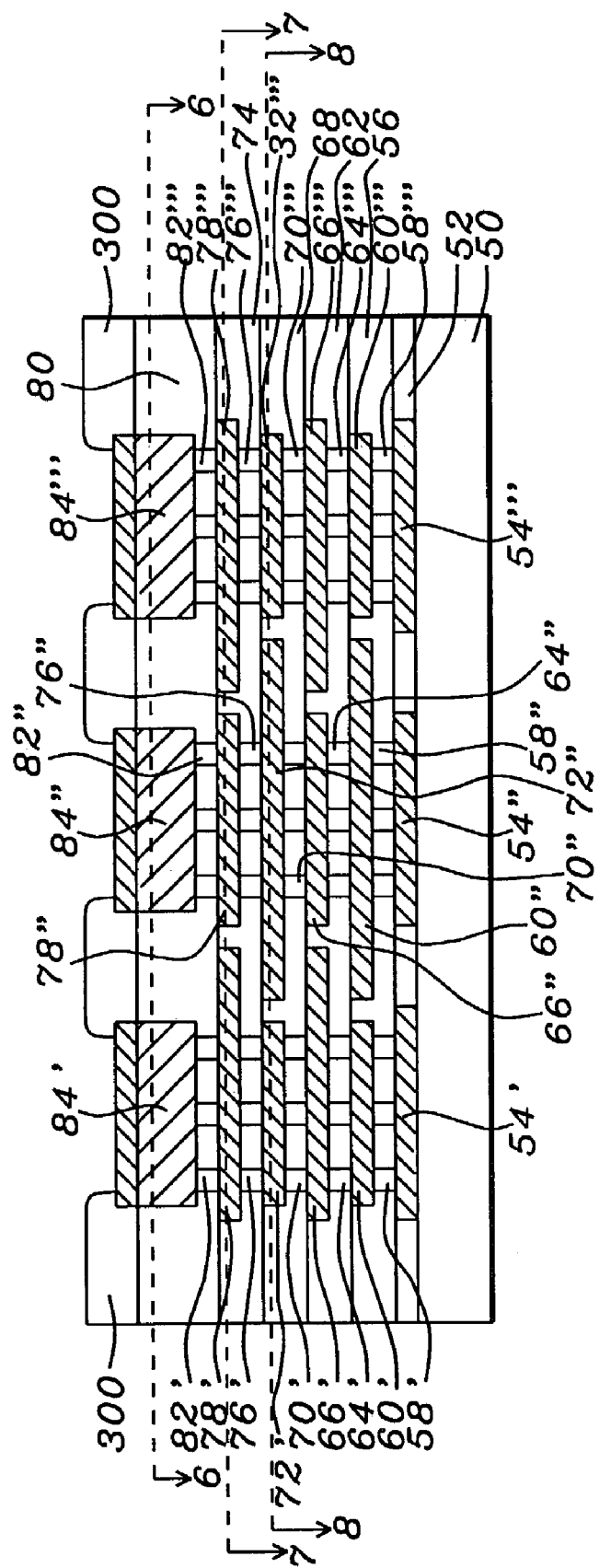
FIGS. 5 to 8 schematically illustrate a second preferred embodiment of the present invention.
Figure 6:
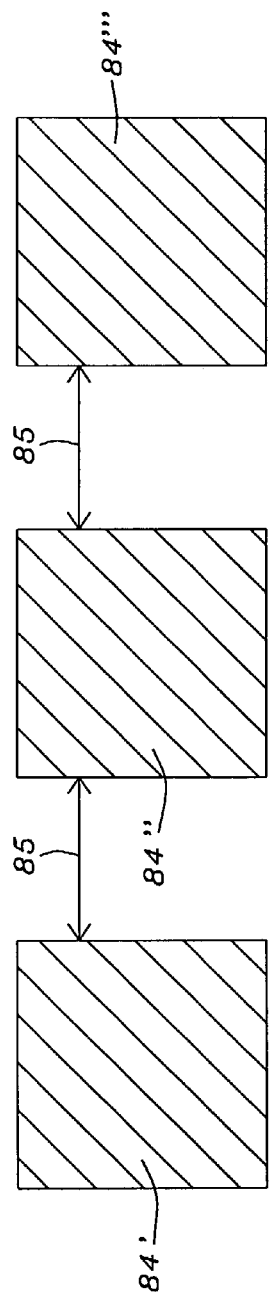
Figure 7:
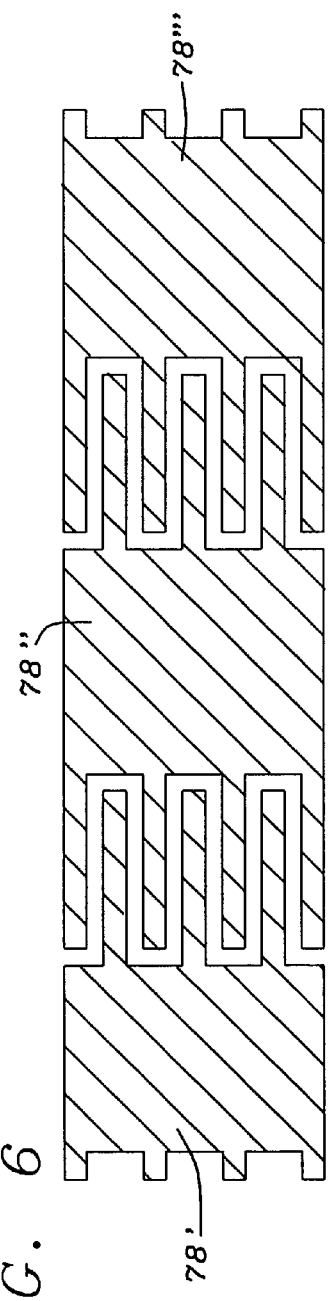
Figure 8:
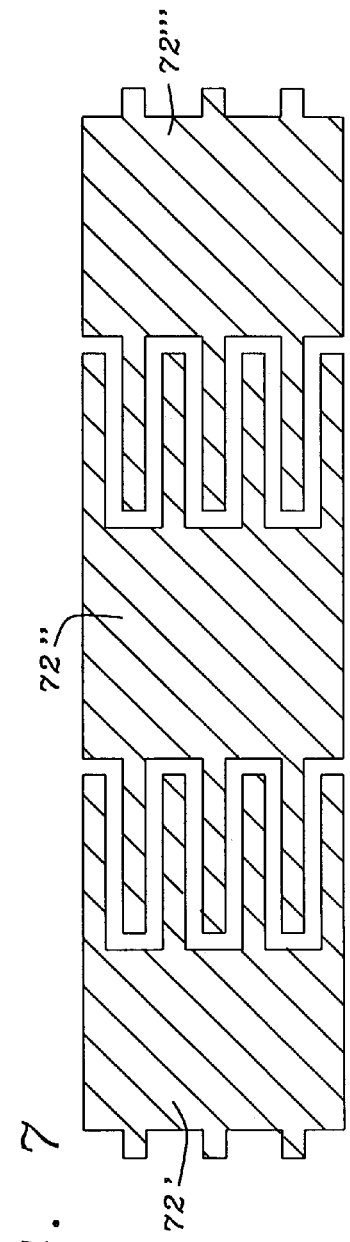

FIGS. 5 to 8 illustrate a second preferred embodiment of the present invention with FIG. 5 being a cross-sectional view and FIGS. 6 to 8 being plan views of FIG. 5 at respective lines 6—6, 7—7 and 8—8 and illustrating only the top metal pads/bonding pads 84', 84", 84''' and the immediately underlying metal pads 78', 78", 78''' and 72', 72", 72''', respectively. In many respects, the structure of the second embodiment is similar to the structure of the first embodiment illustrated in FIGS. 1 to 4.

Cross-Sectional View—FIG. 5

As shown in FIG. 5, substrate 50 has a series of metal pads 54', 54", 54'''; 60', 60", 60'''; 66', 66", 66'''; 72', 72", 72''' and 78', 78", 78''' formed thereover that are separated by respective intermetal dielectric (IMD) layers 56, 62, 68, 74 and connected by a series of respective interconnects/vias 58', 58", 58'''; 64', 64", 64'''; 70', 70", 70''' and 76', 76", 76'''. Respective top metal pads/bonding pads 84', 84", 84''' are separated from the upper metal pads 78', 78", 78''' by uppermost intermetal dielectric (IMD) layer 80 and connected to the upper metal pads 78', 78", 78''' by upper interconnects/vias 82', 82", 82'''. Lowermost metal pads 54', 54", 54''' are formed within dielectric layer 52 formed upon substrate 50. Patterned passivation layer 300 overlies uppermost IMD layer 80, exposing at least a portion of top metal pads/bonding pads 84', 84", 84'''.

Substrate 50 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor substrate" is meant to include devices formed within a semiconductor wafer and the layers overlying the wafer.

Dielectric layer 52 and IMD layers 56, 62, 68, 74 are preferably comprised of low-k dielectric material or fluorine-doped silica glass (FSG). Uppermost IMD layer 80 is preferably comprised of undoped silica glass (USG). Passivation layer 300 is preferably comprised of silicon nitride (SiN).

Interconnects 58', 58", 58'''; 64', 64", 64'''; 70', 70", 70''' and 76', 76", 76''' are preferably comprised of copper or tungsten and are more preferably copper. Metal pads 54', 54", 54'''; 60', 60", 60'''; 66', 66", 66'''; 72', 72", 72''' and 78', 78", 78''' are preferably comprised of copper or aluminum and are more preferably copper. Top metal pads/bonding pads 84', 84", 84''' are preferably comprised of an aluminum layer overlying a copper layer as shown in FIG. 5.

Interlocking Structure of Intermediate Metal Pads 60', 60", 60'''; 66', 66", 66'''; 72', 72", 72''' and 78', 78", 78'''

As shown in FIG. 5, alternating layers of intermediate metal pads 60', 60", 60'''; 66', 66", 66'''; 72', 72", 72''' and 78', 78", 78''' have a vertical interlocking, interleaving design whereby, for example:

one of the upper outer metal pads 78', 78''' (metal pad 78''' as illustrated in FIG. 5) has an extension directed towards upper inner metal pad 78" with the upper inner metal pad 78" having an extension directed towards the other metal pad 78''', 78' (metal pad 78' as illustrated in FIG. 5);
the next lower inner metal pad 72" has an extension extending towards the next lower outer metal pads 72''' directly under upper outer metal pad 78''' with the other next lower outer metal pad 72' having an extension directed towards the lower inner metal pad 72";

with each further lower metal pad layers 66', 66", 66'''; 60', 60", 60''' so alternating to form a bonding pad design having an underlying interlocking, interleaving metal pad design.

It is noted that instead of the inner metal pads 78", 72" having alternating extensions extending left, right, etc. as shown in FIG. 5, the extensions could alternate right, left, etc.

The lowermost metal pads 54', 54", 54''' may also have extensions (not shown) just as do lower metal pads 60', 60", 60''' and may also have non-symmetric extensions.

Although the extensions are illustrated as being rectangular in shape, they may comprise other shapes as well, such as rounded, hooked, rectangular, finger-shaped etc.

Although FIG. 5 illustrates a series of five metal pad layers 54', 54", 54'"; 60', 60", 60'"; 66', 66", 66'"; 72', 72", 72'" and 78', 78", 78'", there may be less or more metal pad layers.

Plan Views—FIGS. 6 to 8

The top metal pads/bonding pads 84', 84", 84'" are preferably rectangular shaped or, as shown in FIG. 2, square shaped for bonding purposes, and are spaced apart as at 85 by preferably from about 2 to 400 μm and more preferably from about 2 to 100 μm. Lowermost metal pads 54', 54", 54'" are also preferably rectangular shaped or square shaped.

Adjacent intermediate metal pads 60', 60", 60'"; 66', 66", 66'"; 72', 72", 72'" and 78', 78", 78'" also have a horizontal interlocking, interleaving design in the horizontal plane as well with FIG. 7 illustrating the interlocking, interleaving design of intermediate metal pads 78', 78", 78'" and FIG. 8 illustrating the interlocking, interleaving design of the next lower intermediate metal pads 72', 72", 72'".

The adjacent metal pads of layers 60', 60", 60'"; 66', 66", 66'"; 72', 72", 72'" and 78', 78", 78'" have an horizontal interlocking, interleaving design whereby, for example:

(see FIG. 7) one of the outer metal pads 78', 78'" (metal pad 78'" as illustrated in FIG. 7) having an upper extension directed towards inner metal pad 78" with the upper inner metal pad 78" having an upper extension directed towards the other metal pad 78'", 78' (metal pad 78' as illustrated in FIG. 7) substantially in line with the upper extension of outer metal pad 78";

on the opposite side of, and below the upper extension of inner metal pad 78" is an extension directed towards the other outer metal pads 78'", 78' (metal pad 78'" as illustrated in FIG. 7) with the outer metal pad 78' having an extension (substantially in line with the inner metal pad 78" extension extending towards outer metal pad 78'") extending towards inner metal pad 78" to form an interlocking, interleaving bonding pad design;

with the (see FIG. 8) the next lower layer of metal pads 32', 32", 32'" having an opposite extension layout as in the upper (immediately above) metal pads 78', 78", 78'" as shown in FIG. 8 to form a bonding pad design having an underlying interlocking, interleaving metal pad design.

Although the extensions are illustrated as being rectangular in shape, they may comprise other shapes as well, such as rounded, hooked, etc.

It is also noted that while inner metal pads 54", 60", 66", 72", 78" (and the corresponding interconnects 58", 64", 70", 76", 82") are active, it is possible to comprise outer metal pads 54', 60', 66', 72', 78' (and the corresponding interconnects 58', 64', 70', 76', 82') and/or outer metal pads 54'", 60'", 66'", 72'", 78'" (and the corresponding interconnects 58'", 64'", 70'", 76'", 82'") as dummy structures.

Figure 9:
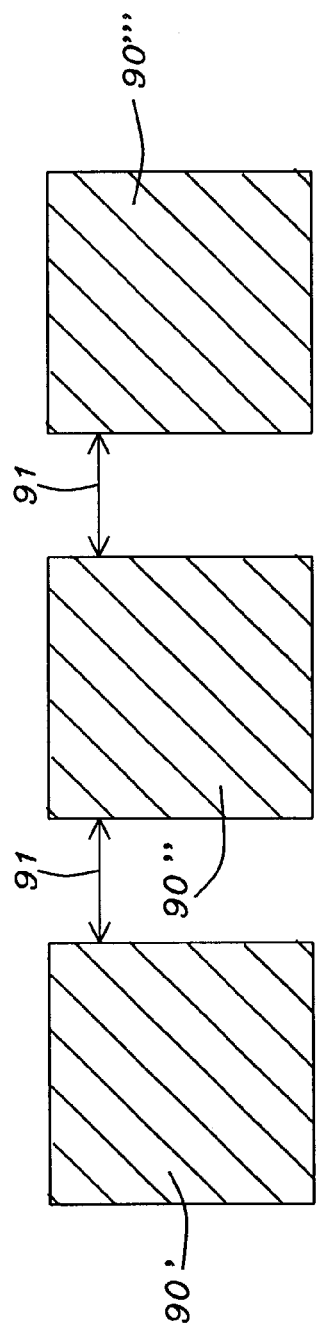
FIGS. 9 and 10 schematically illustrate a third preferred embodiment of the present invention.
Figure 10:
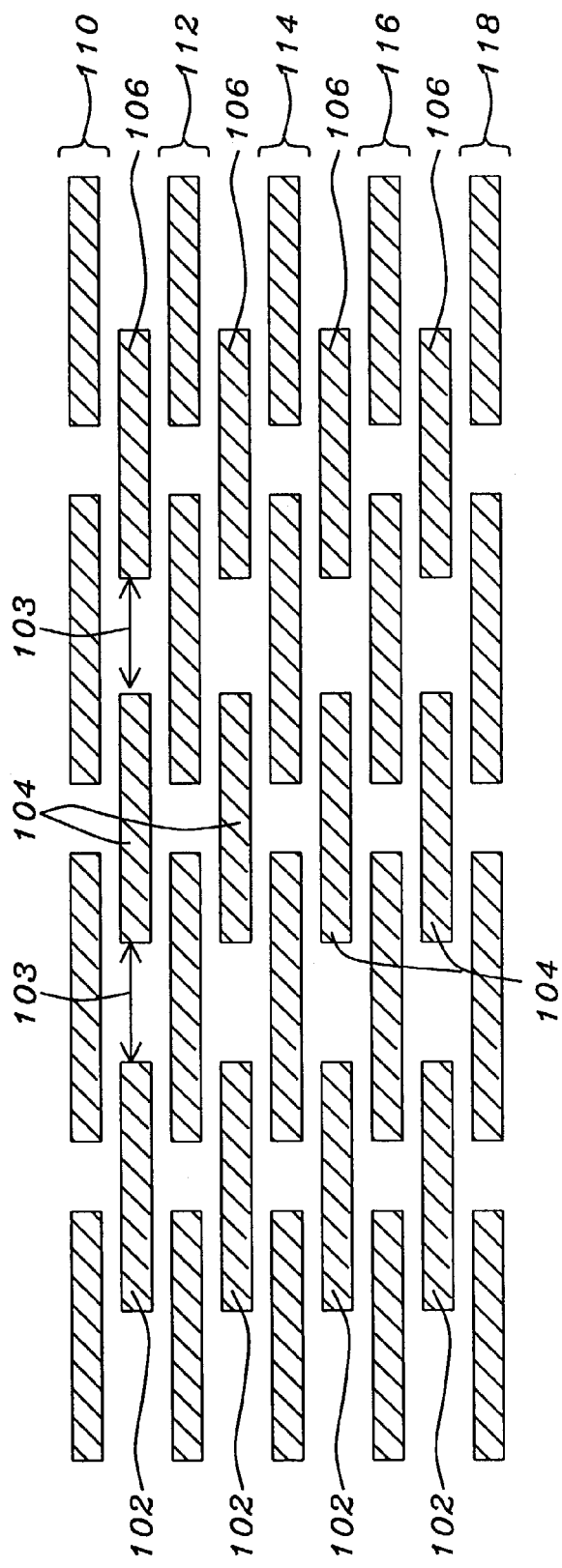

Third Embodiment—FIGS. 9 and 10

FIGS. 9 and 10 illustrate the third preferred embodiment of the present invention with FIG. 9 being a plan view illustrating only the top metal pads/bonding pads 90', 90", 90'" and with FIG. 10 being a plan view illustrating only immediately underlying upper metal pads 102, 104, 106 and upper dummy (i.e. not electrically connected to active devices) interlacing metal structures 110, 112, 114, 116, 118. It is noted that a series of substantially identical underlying lower metal pads and lower dummy interlacing metal structures (not shown) are connected to the respective upper metal pads 102, 104, 106 and respective upper dummy interlacing metal structures 110, 112, 114, 116, 118 and to each respective adjacent layer of lower metal pads and each respective adjacent layer of lower dummy interlacing metal structures by interconnects/vias (not shown). The top metal pads/bonding pads 90', 90", 90'" are likewise connected to the upper metal pads 102, 104, 106 by respective interconnects/vias (not shown).

The interconnects are preferably comprised of copper or tungsten and are more preferably copper. The upper metal pads 102, 104, 106 are preferably comprised of copper or aluminum and are more preferably copper. The dummy interlacing metal structures 110, 112, 114, 116, 118 are preferably comprised of copper or aluminum. The top metal pads/bonding pads 90', 90", 90'" are preferably comprised of aluminum or copper and are more preferably aluminum.

The top metal pads/bonding pads 90', 90", 90'" are preferably rectangular shaped or, as shown in FIG. 9, square shaped for bonding purposes, and are spaced apart as at 91 by preferably from about 2 to 400 μm and more preferably from about 2 to 100 μm.

As shown in FIG. 10, respective adjacent metal pads 102, 104, 106 are separated by respective distances 103 of preferably from about 0.5 to 10 μm. On either side of, and interposed between the respective parallel metal line structures of metal pads 102, 104, 106, are a series of parallel dummy interlacing metal line structures 110, 112, 114, 116, 118 as is repeated for the underlying metal pads and interlacing metal structures, to form a third embodiment bonding pad design having an underlying interlocking, interleaving metal pad design.

Figure 11:
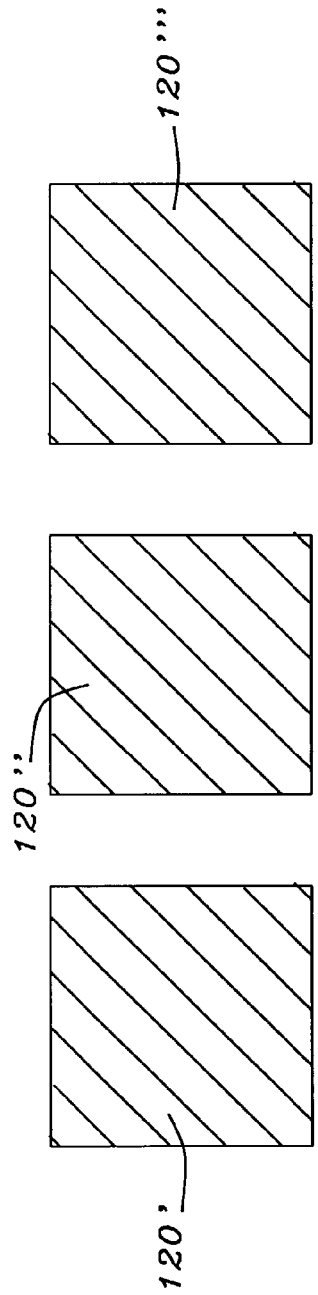
FIGS. 11 and 12 schematically illustrate a fourth preferred embodiment of the present invention.
Figure 12:
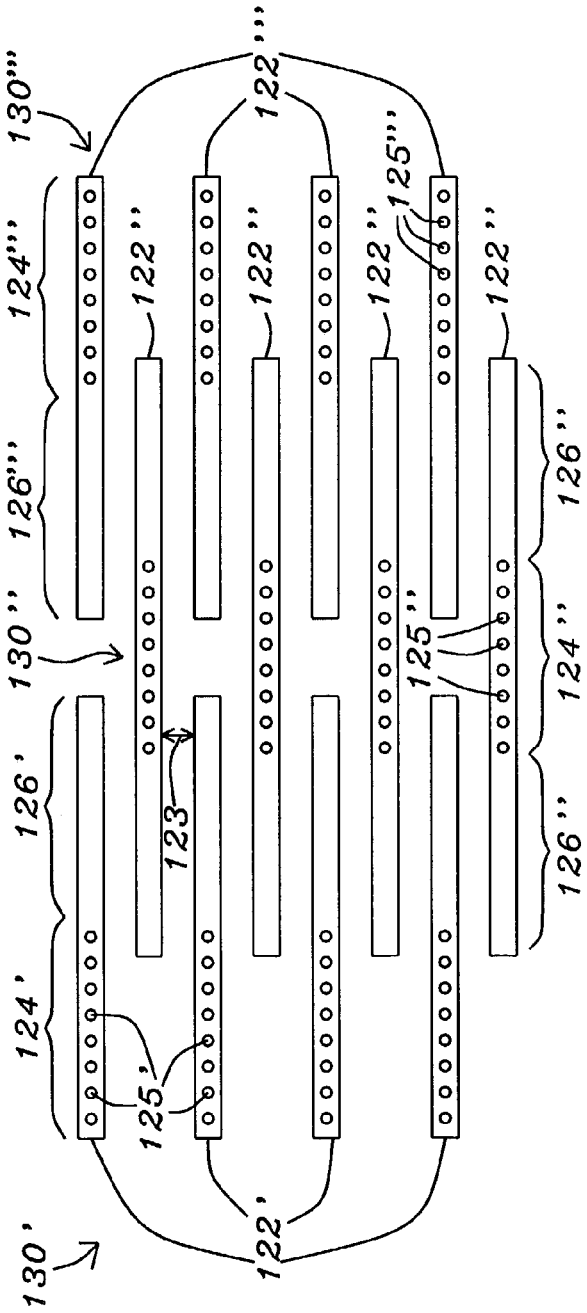

Fourth Embodiment—FIGS. 11 and 12

FIGS. 11 and 12 illustrate the fourth preferred embodiment of the present invention with FIG. 11 being a plan view illustrating only top metal pads/bonding pads 120', 120", 120'" and with FIG. 12 being a plan view illustrating only immediately underlying respective upper metal finger structures 130', 130", 130'" having respective fingers 122', 122", 122'". Finger structures 130', 130", 130'" correspond to the metal pads of the prior embodiments and may be loosely referred to as "pads."

Each series of fingers 122', 122", 122'" comprising upper finger structures 130', 130", 130'" include respective via/interconnect regions 124', 124", 124'" having respective via structures/interconnects connected to the fingers 122', 122", 122'" as at 125', 125", 125'". The outer finger structures 130', 130'" generally include inner dummy regions 126', 126'" and the inner finger structure 130" generally include opposite dummy regions 126" on either side of the respective via/interconnect regions 124" as shown in FIG. 12.

As shown in FIG. 12, the respective dummy region portions 126', 126'" of fingers 122', 122'" of finger structures 130', 130'" interlace with the adjacent respective opposite dummy region portions of fingers 122" of finger structure 130".

It is noted that respective finger structures 130', 130", 130'" are connected to the respective top metal pads/bonding pads 120', 120", 120'" by via structures/interconnects (not shown) as at 125', 125", 125'". Likewise, respective finger structures 130', 130", 130'" are also connected to the respective adjacent lower finger structures (not shown) by via structures/interconnects (not shown) as at respective via structure/interconnect connection points (125', 125", 125'" for upper finger structures 130', 130", 130'").

The via structures/interconnects are preferably comprised of copper or aluminum and are more preferably copper. The upper metal pads 120', 120", 120''' are preferably comprised of copper or aluminum and are more preferably copper. The finger structures 130', 130", 130''' are preferably comprised of copper or aluminum.

The top metal pad/bonding pad 120 is preferably rectangular shaped as shown in FIG. 11 for bonding purposes.

As shown in FIG. 12, the respective series of fingers 122', 122", 122''' are separated by a distances 123 of preferably from about 0.5 μm to 400 μm and more preferably from about 2 μm to 100 μm.

Regardless of which specific embodiment is chosen, the interlocking, interleaving design of the present invention blocks the crack path between pads common to conventional designs, increases adhesion of the bonding pads and redistributes stress. The second embodiment (FIGS. 5 to 8) is the most preferred embodiment as it requires less modification of the current design and every pad is essentially the same.

The second embodiment (FIGS. 5 to 8) is the most preferred embodiment as this embodiment requires less modification to current design and every pad is the same.

Regardless of the embodiment, the special design of the interlocked bonding pads of the present invention are preferably applied to at least the uppermost low-k dielectric layer and are more preferably applied to all of the low-k dielectric layers Advantages of the Present Invention The advantages of one or more embodiments of the present invention include:
1. crack stop geometry;
2. increase adhesive edge of pads;
3. stress redistribution;
4. interlock effects; and
5. there is no significant pad to pad, or finger structure to finger structure, isolation.

While particular embodiments of the present invention have been illustrated and described, it is not intended to limit the invention, except as defined by the following claims.

We claim:

1. A bonding pad design, comprising:
   a semiconductor substrate;
   a first dielectric layer over the semiconductor substrate;
   at least first and second interlocked conductive pads formed within the first dielectric layer, the first and second conductive pads being electrically isolated from each other;
   a second dielectric layer over the first dielectric layer; and
   at least first and second bonding pads formed in the second dielectric layer, the first and second bonding pads being electrically isolated from each other, and wherein the first conductive pad is electrically coupled to the first bonding pad and the second conductive pad is electrically coupled to the second bonding pad.

2. The design of claim 1, wherein the first dielectric layer is comprised of a dielectric material having a dielectric constant of less than about 3.0.

3. The design of claim 1, further including an undoped silica glass dielectric layer over the first dielectric layer.

4. The design of claim 1, further including a second dielectric layer between the first dielectric layer and the semiconductor substrate; the second dielectric layer being comprised of a dielectric material having a dielectric constant of less than about 3.0.

5. A bonding pad design, comprising:
   a substrate;
   a lower series of metal pads upon the substrate, the metal pads in the lower series being electrically isolated from each other; and
   an intermediate series of metal pads over the lower series of metal pads, the metal pads in the intermediate series being electrically isolated from each other, and wherein corresponding ones of the lower series of metal pads and the intermediate series of metal pads are electrically connected by a respective series of intermediate interconnects, the interconnects of the intermediate series being electrically isolated from each other, and wherein at least two of the series of intermediate metal pads are interlocked by a respective series of extensions.

6. The design of claim 5, further including a top series of bonding pads over the intermediate series of metal pads, and an upper series of interconnects, the interconnects of the upper series being electrically isolated from each other, and the bonding pads of the top series being electrically isolated from each other, and being electrically connected to respective metal pads of the intermediate series of metal pads by respective interconnects of the upper series of interconnects.

7. The design of claim 5, wherein the respective series of extensions include a respective series of horizontal extensions and a respective series of vertical extensions.

8. The design of claim 5, wherein the respective series of extensions include a respective series of horizontal extensions and a respective series of vertical extensions; the respective series of horizontal and vertical extensions extending towards adjacent ones of the intermediate and lower series of metal pads.

9. The design of claim 5, wherein the respective series of extensions include a respective series of horizontal extensions.

10. The design of claim 5, wherein the respective series of extensions include a respective series of horizontal extensions extending towards adjacent ones of the intermediate series of metal pads.

11. The design of claim 5, wherein the respective series of extensions include a respective series of vertical extensions.

12. The design of claim 5, wherein the respective series of extensions include a respective series of vertical extensions extending towards adjacent ones of the lower series of metal pads.

13. The design of claim 5, wherein the lower series of metal pads, the intermediate series of metal pads and the respective series of intermediate interconnects are comprised of copper or aluminum.

14. The design of claim 5, wherein the lower series of metal pads, the intermediate series of metal pads and the respective series of intermediate interconnects are comprised of copper.

15. The design of claim 5, wherein a dielectric layer embeds the lower series of metal pads and respective IMD layers embed the intermediate series of metal pads.

16. The design of claim 5, wherein a dielectric layer embeds the lower series of metal pads and respective IMD layers embed the intermediate series of metal pads; the dielectric layer and the respective IMD layers being comprised of undoped silica glass, fluorine-doped silica glass or a dielectric material having a dielectric constant of less than about 3.0.

17. The design of claim 5, wherein a dielectric layer embeds the lower series of metal pads and respective IMD layers embed the intermediate series of metal pads; the dielectric layer and the respective IMD layers being comprised of a dielectric material having a dielectric constant of less than about 3.0.

18. The design of claim 5, wherein a dielectric layer embeds the lower series of metal pads and respective IMD layers embed the intermediate series of metal pads and the respective series of intermediate interconnects.

19. The design of claim 5, wherein the respective series of extensions include a respective series of horizontal extensions and a respective series of vertical extensions; the horizontal extensions being in a respective series of horizontal planes; each of the intermediate series of metal pads comprising a series of metal pads in one of the respective series of horizontal planes; each of the series of metal pads including at least one inner metal pad and two outer metal pads on either side of the inner metal pad; the at least one inner metal pad having a series of extensions extending towards the two outer metal pads; the two outer metal pads having a series of extensions extending towards, and interlocking with, the series of inner metal pad extensions.

20. The design of claim 5, wherein the respective series of extensions include a respective series of horizontal extensions and a respective series of vertical extensions; the horizontal extensions being in a respective series of horizontal planes; each of the intermediate series of metal pads comprising a series of metal pads in one of the respective series of horizontal planes; each of the series of metal pads including at least one inner metal pad and two outer metal pads on either side of the inner metal pad; the at least one inner metal pad having a series of opposing extensions extending towards the two outer metal pads; the two outer metal pads having a series of extensions extending towards, and interlocking with, the series of inner metal pad opposing extensions.

21. The design of claim 5, wherein the respective series of extensions include a respective series of horizontal extensions and a respective series of vertical extensions; the horizontal extensions being in a respective series of horizontal planes; each of the intermediate series of metal pads comprising a series of metal pads in one of the respective series of horizontal planes; each of the series of metal pads including at least one inner metal pad and two outer metal pads on either side of the inner metal pad; the at least one inner metal pad having a series of non-opposing extensions extending towards the two outer metal pads; the two outer metal pads having a series of extensions extending towards, and interlocking with, the series of inner metal pad non-opposing extensions.

22. The design of claim 5, wherein the respective series of extensions include a respective series of horizontal extensions and a respective series of vertical extensions; the horizontal extensions being in a respective series of horizontal planes; each of the intermediate series of metal pads comprising a series of metal pads in one of the respective series of horizontal planes; each of the series of metal pads including at least one inner metal pad and two outer metal pads on either side of the inner metal pad; the at least one inner metal pad having a series of extensions extending towards the two outer metal pads; the two outer metal pads having a series of extensions extending towards, and interlocking with, the series of inner metal pad extensions; at least one of the inner metal pad and the at least two outer metal pads of each series of metal pads being dummy metal pads.

23. The design of claim 5, wherein the each of the intermediate series of metal pads comprise a series of parallel metal structures; the respective series of extensions comprising a series of parallel dummy metal structures interleaved with the series of parallel metal structures comprising the intermediate series of metal pads to interlock the intermediate series of metal pads.

24. The design of claim 5, wherein the each of the intermediate series of metal pads comprise finger structures; the respective finger structures comprising respective fingers; the respective series of extensions comprising dummy regions within the respective fingers.

25. A bonding pad design, comprising:
a substrate;
a lower series of metal pads upon the substrate, the metal pads of the lower series being electrically isolated from each other;
an intermediate series of metal pads over the lower series of metal pads, the metal pads in the intermediate series being electrically isolated from each other, and wherein corresponding ones of the lower series of metal pads and the intermediate series of metal pads are electrically connected by a respective series of intermediate interconnects, the interconnects of the intermediate series being electrically isolated from each other, and wherein at least two of the series of intermediate metal pads are interlocked by a respective series of extensions; and
a top series of bonding pads over the intermediate series of metal pads, and an upper series of interconnects, the interconnects of the upper series being electrically isolated from each other, and the bonding pads of the top series being electrically isolated from each other and being electrically connected to corresponding ones of the intermediate series of metal pads by respective interconnects of the upper series of interconnects.

26. The design of claim 25, wherein the respective series of extensions include a respective series of horizontal extensions and a respective series of vertical extensions; the respective series of horizontal and vertical extensions extending towards adjacent ones of the lower and intermediate series of metal pads.

27. The design of claim 25, wherein the respective series of extensions include a respective series of horizontal extensions extending towards adjacent ones of the intermediate series of metal pads.

28. The design of claim 25, wherein the respective series of extensions include a respective series of vertical extensions extending towards adjacent ones of the lower series of metal pads.

29. The design of claim 25, wherein a dielectric layer embeds the lower series of metal pads and respective IMD layers embed the intermediate series of metal pads; the dielectric layer and the respective IMD layers being comprised of undoped silica glass, fluorine-doped silica glass or a dielectric material having a dielectric constant of less than about 3.0.

30. The design of claim 25, wherein a dielectric layer embeds the lower series of metal pads and respective IMD layers embed the intermediate series of metal pads and the respective series of intermediate interconnects.

31. The design of claim 25, wherein the top series of bonding pads are square shaped.

32. The design of claim 25, wherein the top series of bonding pads are rectangular shaped.

33. A bonding pad design, comprising:
a substrate;
a lower series of metal pads upon the substrate, the metal pads in the lower series being electrically isolated from each other;

an intermediate series of metal pads over the lower series of metal pads, the metal pads in the intermediate series being electrically isolated from each other, and wherein corresponding ones of the lower series of metal pads and the intermediate series of metal pads are electrically connected by a respective series of intermediate interconnects, the interconnects of the intermediate series being electrically isolated from each other, and wherein at least two of the series of intermediate metal pads are interlocked by a respective series of extensions; and a top series of bonding pads over the intermediate series of metal pads, and an upper series of interconnects, the interconnects of the upper series being electrically isolated from each other, and the bonding pads of the top series being electrically isolated from each other, and being electrically connected to corresponding ones of the intermediate series of metal pads by respective interconnects of the upper series of interconnects; wherein the lower series of metal pads, the intermediate series of metal pads, the respective series of intermediate interconnects and the upper series of interconnects are comprised of aluminum or copper.

34. The design of claim 33, wherein a dielectric layer embeds the lower series of metal pads and respective IMD layers embed the intermediate series of metal pads; the dielectric layer and the respective IMD layers being comprised of undoped silica glass, fluorine-doped silica glass or a dielectric material having a dielectric constant of less than about 3.0.

35. The design of claim 33, wherein the respective series of extensions include a respective series of horizontal extensions and a respective series of vertical extensions; the horizontal extensions being in a respective series of horizontal planes; each of the intermediate series of metal pads comprising a series of metal pads in one of the respective series of horizontal planes; each of the series of metal pads including at least one inner metal pad and two outer metal pads on either side of the inner metal pad; the at least one inner metal pad having a series of extensions extending towards the two outer metal pads; the two outer metal pads having a series of extensions extending towards, and interlocking with, the series of inner metal pad extensions.

36. The design of claim 33, wherein the respective series of extensions include a respective series of horizontal extensions and a respective series of vertical extensions; the horizontal extensions being in a respective series of horizontal planes; each of the intermediate series of metal pads comprising a series of metal pads in one of the respective series of horizontal planes; each of the series of metal pads including at least one inner metal pad and two outer metal pads on either side of the inner metal pad; the at least one inner metal pad having a series of opposing extensions extending towards the two outer metal pads; the two outer metal pads having a series of extensions extending towards, and interlocking with, the series of inner metal pad opposing extensions.

37. The design of claim 33, wherein the respective series of extensions include a respective series of horizontal extensions and a respective series of vertical extensions; the horizontal extensions being in a respective series of horizontal planes; each of the intermediate series of metal pads comprising a series of metal pads in one of the respective series of horizontal planes; each of the series of metal pads including at least one inner metal pad and two outer metal pads on either side of the inner metal pad; the at least one inner metal pad having a series of extensions extending towards the two outer metal pads; the two outer metal pads having a series of extensions extending towards, and interlocking with, the series of inner metal pad extensions; at least one of the inner metal pad and the at least two outer metal pads of each series of metal pads being dummy metal pads.

38. The design of claim 33, wherein the top series of bonding pads comprise at least two bonding pads separated by a distance of from about 2 to 400 µm.

39. A bonding pad structure comprising:
a first dielectric layer having first and second bonding pads positioned thereon, the first and second bonding pads being electrically isolated from each other;
a second dielectric layer positioned under the first dielectric layer;
a third dielectric layer positioned under the second dielectric layer;
first and second conductive pads positioned in the second dielectric layer, the first and second conductive pads being electrically isolated from each other, and being electrically connected to the first and second bonding pads respectively, wherein the first and second conductive pads include extensions for interlacing with one another; and
third and fourth conductive pads positioned in the third dielectric layer, the third and fourth conductive pads being electrically isolated from each other, and being electrically connected to the first and second conductive pads respectively, wherein the third and fourth conductive pads include extensions for interlacing with one another, and wherein the extensions of the third and fourth conductive pads are reversed from those of the first and second conductive pads.

40. The bonding pad structure of claim 39 wherein at least one of the first and third conductive pads has at least a portion that is offset in a horizontal direction with respect to the first bonding pad.

41. The bonding pad structure of claim 40 wherein at least one of the second and fourth conductive pads is aligned in a horizontal direction with respect to the second bonding pad.

42. The bonding pad structure of claim 39 further comprising:
a fourth dielectric layer positioned under the third dielectric layer; and
fifth and sixth conductive pads positioned in the fourth dielectric layer, the fifth and sixth conductive pads being electrically isolated from each other, and being electrically connected to the third and fourth conductive pads respectively, wherein the fifth and sixth conductive pads include extensions for interlacing with one another, and wherein the extensions of the fifth and sixth conductive pads are identical to those of the first and second conductive pads.

43. The bonding pad structure of claim 42 wherein the fifth conductive pad has at least a portion that is offset in a horizontal direction with respect to the first bonding pad.

* * * * *